United States Patent
Criniti et al.

[11] Patent Number: 6,108,206
[45] Date of Patent: Aug. 22, 2000

[54] SEMICONDUCTOR THERMAL PROTECTION ARRANGEMENT

[75] Inventors: Joseph Criniti, New Britain; Javier I. Larranaga, Bristol; Edward E. Kim, Burlington; Esteban Santos, Farmington; Nathaniel B. Vicente, Bridgeport, all of Conn.

[73] Assignee: General Electric Company, Schenectady, N.Y.

[21] Appl. No.: 09/337,095

[22] Filed: Jun. 21, 1999

[51] Int. Cl.[7] ................................................. H05K 7/20
[52] U.S. Cl. .................... 361/704; 361/687; 361/392; 361/695; 361/717; 361/796; 62/259.2; 174/16.3; 257/713
[58] Field of Search .................... 361/687–692, 361/699, 700–710, 719–721, 19, 796, 784–788, 683; 165/3, 22, 26–27, 32, 34, 80.2, 80.3, 80.4, 25, 104.33, 104.34, 908, 165, 185; 62/401, 259.2, 373, 504; 174/16.3, 15.1, 15 R, 16 HS, 16 R

[56] References Cited

U.S. PATENT DOCUMENTS

| | | |
|---|---|---|
| 3,854,631 | 12/1974 | Moen . |
| 4,142,136 | 2/1979 | Witter . |
| 4,848,090 | 7/1989 | Peters . |
| 5,034,688 | 7/1991 | Moulene et al. . |
| 5,183,104 | 2/1993 | Novotny ........................ 165/104.33 |
| 5,341,080 | 8/1994 | Sanz . |
| 5,690,468 | 11/1997 | Hong . |

*Primary Examiner*—Leo P. Picard
*Assistant Examiner*—Michael Datskovsky
*Attorney, Agent, or Firm*—Cantor Colburn LLP; Carl B. Horton

[57] ABSTRACT

A cooling assembly for semiconductor devices in the form of an enclosure including an inlet and outlet with a semiconductor support assembly is presented. The air passage connection with the inlet defines vortex configuration for the rapid transport of compressed air to the semiconductor devices arranged between the enclosure inlet and outlet.

15 Claims, 3 Drawing Sheets

SEMICONDUCTOR THERMAL PROTECTION ARRANGEMENT

BACKGROUND OF THE INVENTION

This invention relates to semiconductor switches and, more particularly, to a thermal protection arrangement for semiconductor switches such as used in motor control devices.

Motor control devices having controlled "soft start" and "soft stop" function wherein the motor is protected from overcurrent surges during both starting and starting operations are described within U.S. Pat. No. 5,341,080 entitled Apparatus and Three Phase Induction Motor Starting and Stopping Control Method.

Semiconductor switches such as silicone controlled rectifiers (SCR), when used within each pole of a multi-pole electric motor to control the starting and stopping function can become subjected to thermal damage when an attempt is made to re-start a motor while the SCR's are warm from previous operation. Motor control devices utilizing thermal enclosures for cooling the semiconductor switches used to control the motor start and stop functions are described in U.S. patent application Ser. No. 08/904,293, filed Jul. 31, 1997 entitled Compact Electrical Enclosure.

U.S. Pat. No. 3,854,631 entitled Motor Starter Unit, describes a lockout counter to prevent motor restart after a predetermined number of motor starts to protect the electric motor and associated electric equipment from thermal damage. Since the cool down rates for electric motor windings and SCR junctions are not the same, a predetermined start inhibit signal to protect motor windings within electric motors exterior to a motor controller cabinet may not be sufficient to prevent thermal damage to the SCR's used within the motor controller unit contained within the cabinet.

The use of thermal fluid transport devices in contact with semiconductor components is found within U.S. Pat. No. 4,848,090 entitled Apparatus for Controlling the Temperature of an Integrated Circuit Package and U.S. Pat. No. 5,034,688 entitled Temperature-Conditioning Support for Small Objects Such as Semiconductor Components and Thermal Regulation Process Using Said Support. Both of the aforementioned patents describe the use of a thermal sensing device used in feed-back relation to a fluid transport device to control the operating temperatures of the semiconductor components. The size of the fluid transport pipes and heat sink supports are of sufficient size to insure adequate cooling of the semiconductors when used within circuits containing induction motors.

The use of a fan assembly and heat sink support, per se, to control the temperature of semiconductor components is described within U.S. Pat. No. 5,690,468 entitled Fan Assembly for an Integrated Circuit. It is believed that the use of a fan assembly and heat sink support within motor control devices would require over-sized fans to provide sufficient air flow to meet the SCR cooling requirements, and that such fan assembly could introduce air-borne contaminants, such as dust, dirt and the like.

SUMMARY OF THE INVENTION

In an exemplary embodiment of the invention, a cooling assembly for semiconductor devices in the form of an enclosure including an inlet and outlet includes a semiconductor support assembly is presented. The air passage connection with the inlet defines a vortex configuration for the rapid transport of compressed air between the enclosure inlet and outlet for adiabatic air expansion thereby allowing cool air to be injected between the enclosure inlet and outlet. An electronic temperature sensor within the enclosure increases or decreases air flow depending upon the ambient temperature within the enclosure. The present invention provides controlled cooling of the SCR's used within such motor control devices, as well as other higher power applications, without requiring venting of the entire motor control enclosure, oversized fans or expensive fluid transport pipes and heat sink support.

DESCRIPTION OF THE PREFERRED EMBODIMENT

Figure 1:
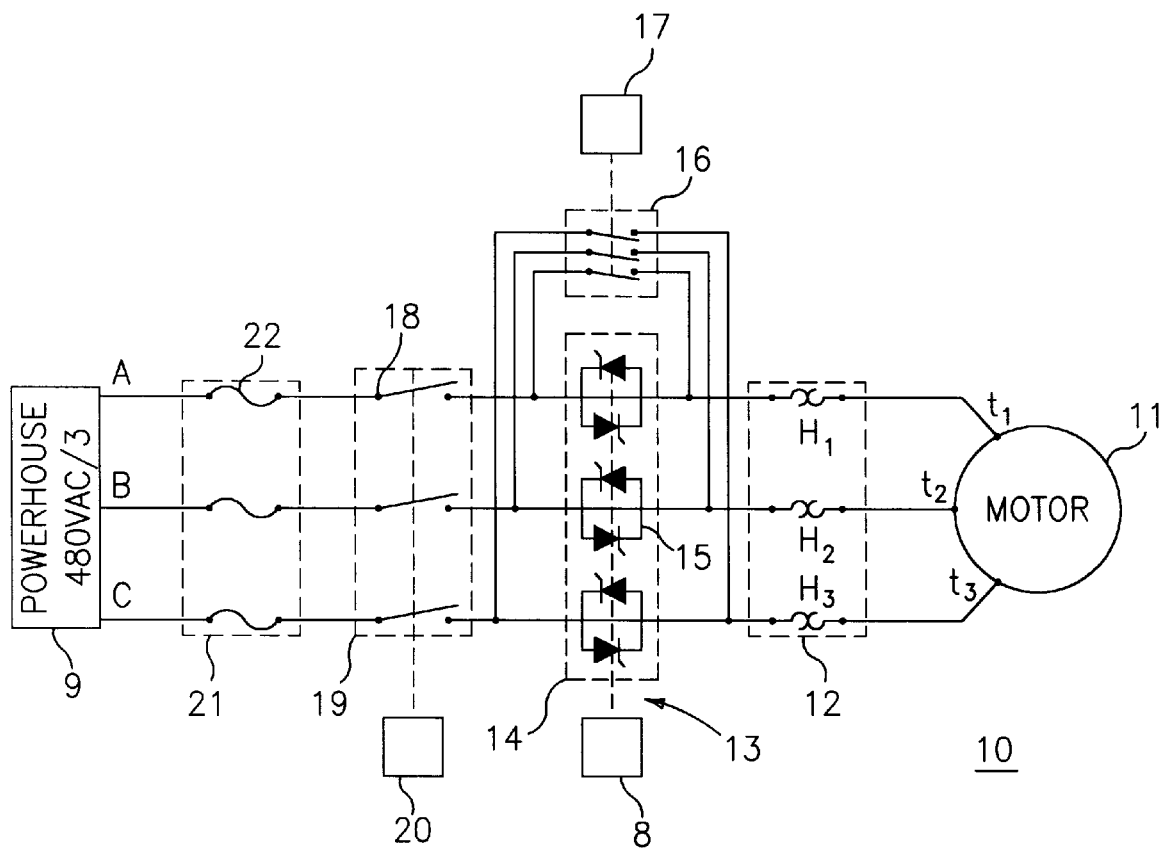
FIG. 1 is a diagrammatic representation of a motor controller unit control circuit that includes the cooling assembly in accordance with the invention.

A simple motor controller unit 10, similar to that described within U.S. Pat. No. 4,142,136 entitled Control Circuit for Starting a Motor, which is incorporated by reference, is shown in FIG. 1. Three semiconductor switches 15, such as thyristors, SCR's, or triacs, contained within a semiconductor enclosure 14 are connected in series between the three phases A, B, C of a three phase electrical power distribution system and the corresponding phases $t_1$, $t_2$, $t_3$ within a three phase induction motor 11. Each of the switches are connected in anti-parallel to allow current flow in both directions on both positive and negative cycles of the power system. Circuit breakers or fuses 22 within a protection enclosure 21 connect between the power system 9 and ON/OFF switches 18 within a first switch enclosure 19, controlled by a first switch operator 20 to protect the motor and semiconductor switches from overcurrent circuit conditions. A second switch arrangement 16 controlled by a second switch operator 17 connects the semiconductor switches 15 in and out of circuit with the motor contactor unit 12 and the motor 11, and a semiconductor control circuit 8 provides turn on and turn off function to the semiconductor switches in the manner described within the aforementioned U.S. Pat. No. 5,341,080 entitled Apparatus and Three Phase Induction Motor Starting and Stopping Control Method, which is incorporated by reference.

Figure 2:
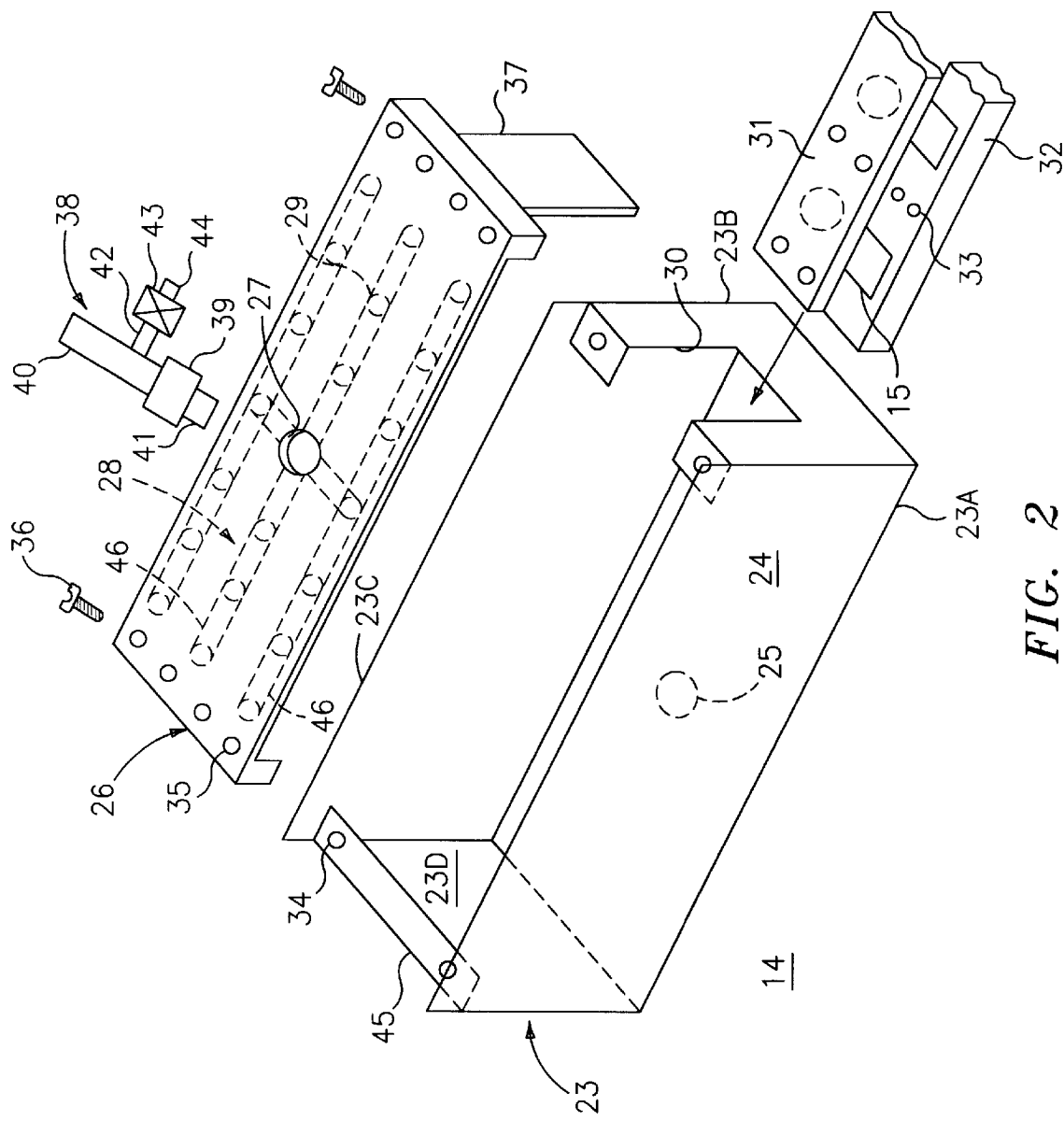
FIG. 2 is an enlarged top perspective view of the components of the cooling assembly of FIG. 1.

Semiconductor enclosure 14 is shown in FIG. 2 prior to assembly. The enclosure defines a thermally-insulative case 23 having four sidewalls 23A–23D upstanding from a bottom plate 24 with an aperture 25 formed in the bottom plate for the exhaust of air from the case in the manner to be described below. Semiconductor switches 15 are shown attached to top and bottom electric bus conductors 31, 32 for providing electric connection with a motor controller circuit 13 (FIG. 1). Air transport apertures 33 formed within the top and bottom bus conductors provide for the passage of air through the interior of the insulative case (plate) 23 along with providing additional cooling function to the bus conductors, per se. The bus conductors and semiconductor switches are placed within the insulative case 23 by means of a slotted aperture 30 formed within the sidewall 23B and the aperture is sealed by means of the extension 37 depending downwardly from a cover 26 when the cover is attached to the insulative case by screws 36 extending through apertures 35 formed in cover 26 and into threaded apertures 34 in rims 45 formed on the opposing sidewalls 23B, 23D.

Air distribution through the interior of case 23 is facilitated by means of a manifold 28 formed on the bottom surface of the cover that includes distribution pipes 46 and apertures 29. An important feature of the invention is the provision of a vortex tube 38 on the top of the cover 26 by threadingly engaging a vortex tube outlet cylinder 41 within a cover entrance aperture (opening) 27. One such vortex tube is a type ARTX obtained from Exair Corporation. Vortex tube 38 includes a hot air outlet cylinder 40 at one end and an operating chamber 39 formed between the inlet and outlet cylinders. To control the air flow into the vortex tube 38, a solenoid 43 is connected between the compressed air inlet 42 extending from the side of the vortex tube and the compressed air connector, indicated at 44. The compressed air transfers through the manifold 28 whereby the air expands adiabatically and is distributed throughout the interior of the insulative enclosure and exits through the aperture 25 in the bottom 24. Apertures 33 through the top and bottom electric bus conductors 31, 32 assist in the distribution of cooling air to the semiconductor elements 15 connecting therebetween. A thermistor 47 intermediate the semiconductor elements and the electric bus conductors connects with solenoid 43 (FIG. 2) to control the air flow in the manner similar to a thermostat wherein the solenoid is opened under upon occurrence of a predetermined temperature and closed when the ambient temperature is lower than the predetermined temperature to insure that the semiconductor elements remain at a predetermined level. One example of a thermistor control circuit is found U.S. patent application Ser. No. 09/037,689 entitled Smart Residential Circuit Breaker, which is incorporated by reference.

Figure 3:
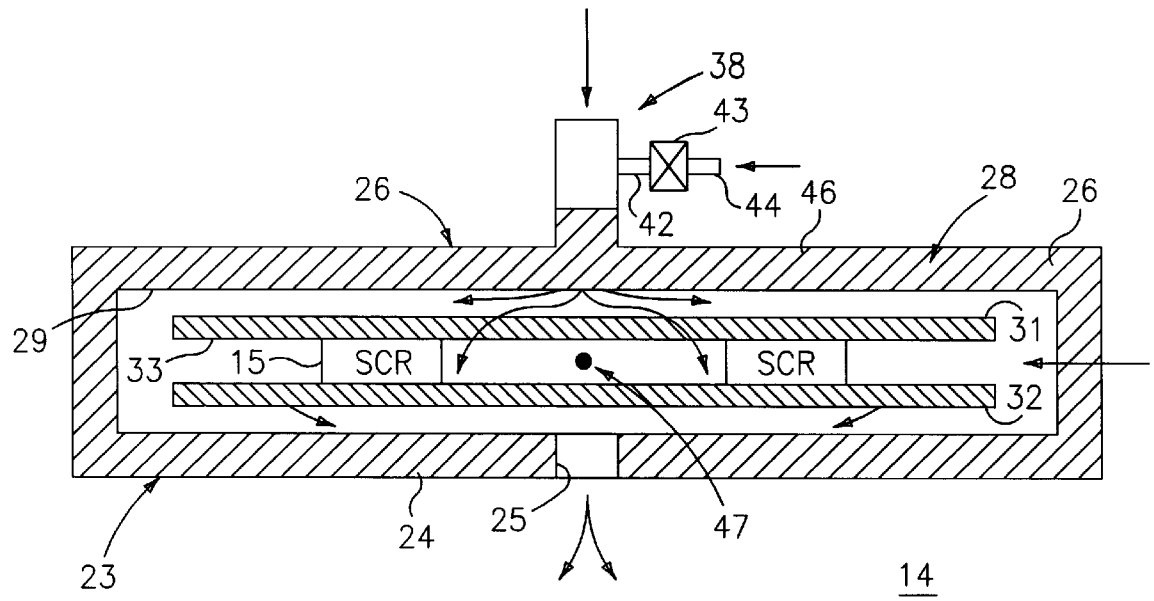
FIG. 3 is an enlarged side view in partial section of the components within the cooling assembly of FIG. 2.
Figure 4:
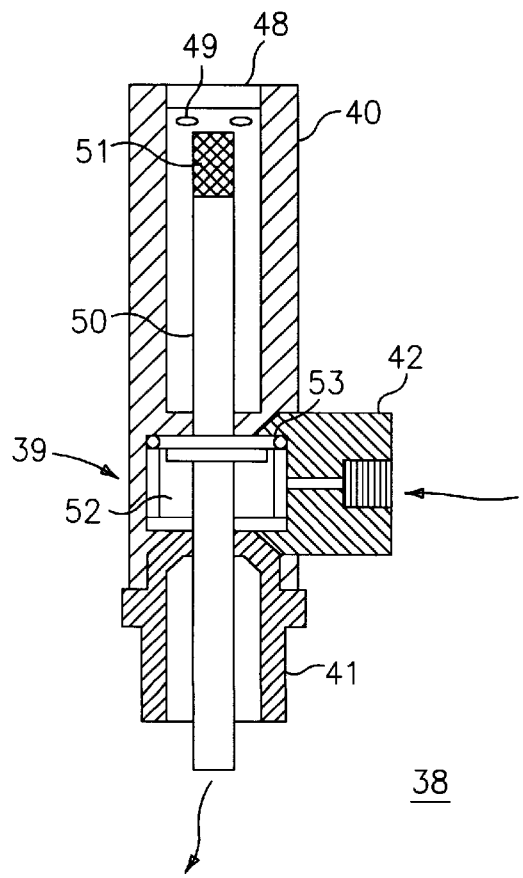
FIG. 4 is an enlarged side view in partial section of the components within the vortex tube used with the cooling assembly of FIG. 2.

The vortex tube 38 is shown in FIG. 4 in enlarged detail to depict a cap 48 at the hot air output end to allow exit of the heated air through apertures 49 in the sidewall of the hot air outlet cylinder 40. An exhaust sleeve 50, extending within the interior of the vortex tube terminates at a muffler 51 at one end, extends through the vortex generator 52, and terminates within the exit tube 41 at the cold end of the vortex tube 38. The vortex generator 52 is separated from the interior of the vortex tube 38 by an O-ring 53 extending within the chamber 39, and receives the incoming compressed air through the compressed air inlet 42. The compressed air rapidly rotates the air stream within the vortex generator causing the inner portion of the air stream to become heated and exit out apertures 49 at the hot air output end of the vortex tube 38 while cooling the outer portion of the air stream and forcing the cooled air out the exit tube 41 and into the semiconductor enclosure 14 shown in FIG. 3.

The efficiently cooled semiconductor enclosure of the invention has been shown to be effective when used with inductive motor circuits. It is believed that the same arrangement may be advantageously employed within other medium voltage devices that generate heat during start-up and overcurrent operating conditions.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor cooling chamber comprising:
   a top cover having opposing top and bottom surfaces, said bottom surface including a manifold formed thereon for uniform distribution of air and an inlet opening formed within said top surface for admission of air;
   a bottom plate secured to said cover and having an outlet opening formed therethrough for exit of air;
   an enclosure intermediate said top cover and said bottom plate, said enclosure having means for supporting a semiconductor device; and,
   a vortex tube connecting with said inlet opening and a source of pressurized air to provide cooling air to said semiconductor device.

2. The chamber of claim 1 wherein said enclosure further includes:
   a thermistor proximate said semiconductor device; and
   a solenoid connecting with said vortex tube, said thermistor providing turn-on and turn-off function to said solenoid for maintaining a predetermined temperature within said enclosure.

3. The chamber of claim 1 wherein said vortex tube includes:
   a vortex generator for converting said cooling air into inner and outer flow streams, said inner flow stream becoming heated and exiting from a hot end of said vortex tube and said outer flow stream becoming cooled and exiting from a cool end of said vortex tube.

4. A motor controller comprising:
   a plurality of semiconductor devices;
   a plurality of electric switches arranged for connecting between an electric power source and said semiconductor devices;
   an electric contactor arranged for connecting between said semiconductor devices and an induction motor;
   a semiconductor chamber, said semiconductor devices being arranged within said semiconductor chamber, said semiconductor chamber comprising a top cover having opposing top and bottom surfaces, said bottom surface including a manifold formed thereon for uniform distribution of air and an inlet opening formed within said top surface for admission of air, a vortex tube connecting with said inlet opening and a source of pressurized air to provide cooling air to said semiconductor devices; and
   a bottom plate secured to said cover and having an outlet opening formed therethrough for exit of air and a semiconductor enclosure intermediate said top cover and said bottom plate, said semiconductor enclosure having means for supporting said semiconductor device.

5. The motor controller of claim 4 wherein said semiconductor devices are selected from the group consisting of silicone controlled rectifiers, thyristors and triacs.

6. The motor controller of claim 4 wherein said semiconductor enclosure further includes:
   a thermistor proximate said semiconductor devices; and
   a solenoid connecting with said vortex tube, said thermistor providing turn-on and turn-off function to said solenoid for maintaining a predetermined temperature within said enclosure.

7. The motor controller of claim 4 wherein said vortex tube includes a vortex generator for converting said cooling air into inner and outer flow streams, said inner flow stream becoming heated and exiting from a hot end of said vortex tube and said outer flow stream becoming cooled and exiting from a cool end of said vortex tube.

8. The chamber of claim 1 wherein said semiconductor device is selected from the group consisting of a silicone controlled rectifier, a thyristor and a triac.

9. A semiconductor cooling chamber comprising:
- a top cover having opposing top and bottom surfaces, said top surface having an inlet opening for admission of air, said bottom surface including a manifold having a plurality of distribution pipes connected to the inlet opening and running parallel to the top and bottom surfaces of the cover, each distribution pipe having a plurality of apertures for uniform distribution of air into the chamber;
- a bottom plate secured to said cover and having an outlet opening formed therethrough for exit of air from the chamber; and
- an enclosure intermediate said top cover and said bottom plate, said enclosure housing a pair of electric bus conductors adapted to sandwich at least one semiconductor device therebetween, each electric bus conductor having air transport apertures for allowing passage of air between the pair of electric bus conductors.

10. The chamber of claim 9 further comprising a thermistor positioned between said pair of electric bus conductors, said thermistor adapted for detecting temperature of said at least one semiconductor device.

11. The chamber of claim 9 further comprising a vortex tube connecting with said inlet opening and a source of pressurized air to provide cooling air to said semiconductor device.

12. The chamber of claim 11 further comprising a thermistor positioned between said pair of electric bus conductors, and further comprising a solenoid connecting with said vortex tube, said thermistor providing turn-on and turn-off function to said solenoid for maintaining a predetermined temperature within said enclosure.

13. The chamber of claim 11 wherein said vortex tube comprises:
- a vortex generator for converting said cooling air into inner and outer flow streams, said inner flow stream becoming heated and exiting from a hot end of said vortex tube and said outer flow stream becoming cooled and exiting from a cool end of said vortex tube.

14. The chamber of claim 9 further comprising at least one semiconductor device sandwiched between said pair of electric bus conductors.

15. The chamber of claim 14 wherein said at least one semiconductor device is selected from the group consisting of a silicone controlled rectifier, a thyristor, and a triac.

* * * * *

UNITED STATES PATENT AND TRADEMARK OFFICE
CERTIFICATE OF CORRECTION

PATENT NO. : 6,108,206
DATED : August 22, 2000
INVENTOR(S) : Joseph Criniti et al.

It is certified that error appears in the above-identified patent and that said Letters Patent is hereby corrected as shown below:

<u>Title page,</u>
Item [75], Inventors, delete "Nathaniel" and insert therefor -- Nataniel --

Signed and Sealed this

Fourth Day of November, 2003

JAMES E. ROGAN
*Director of the United States Patent and Trademark Office*